US006836526B2

(12) United States Patent
Rana (10) Patent No.: US 6,836,526 B2
(45) Date of Patent: Dec. 28, 2004

(54) FRACTIONAL-N SYNTHESIZER WITH TWO CONTROL WORDS

(75) Inventor: Ram Singh Rana, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 22 days.

(21) Appl. No.: 10/373,465

(22) Filed: Feb. 25, 2003

(65) Prior Publication Data

US 2004/0165691 A1 Aug. 26, 2004

(51) Int. Cl.$^7$ .................................................. H03K 21/00
(52) U.S. Cl. .......................................... 377/47; 377/48
(58) Field of Search ..................................... 377/47, 48

(56) References Cited

U.S. PATENT DOCUMENTS

| | | | |
|---|---|---|---|
| 4,758,802 A | 7/1988 | Jackson | 331/10 |
| 5,124,670 A | 6/1992 | Lawton | 331/10 |
| 5,224,132 A | 6/1993 | Goldberg | 377/48 |
| 5,256,981 A | * 10/1993 | Fountain | 327/69 |
| 5,714,896 A | 2/1998 | Nakagawa et al. | 327/115 |
| 5,777,521 A | 7/1998 | Gillig et al. | 331/16 |
| 6,219,397 B1 | 4/2001 | Park | 375/376 |

OTHER PUBLICATIONS

"Fractional–N Synthesizers—White Paper", Staff, Conexant Systems, Inc., Newport Beach CA, Feb. 2001, pp. 1–21.
"A Low Phase Noise C–Band Frequency Synthesizer Using a New Fractional—N PLL with Programmable Fractionality", Nakagawa, et al., IEEE Trans. on Microwave Theory and Techniques, vol. 44, No. 2, Feb. 1996, pp. 344–346.

"Application Note for SA8025 Fractional–N synthesizer for 2GHz band applications, " An 1891, Djen, Philips Semiconductors, Aug. 20, 1997.

"A 5 Ghz, 32 Mw CMOS Frequency Synthesizer With an Injection Locked Frequency Divider," Rategh, et al., Digest of Tech. Papers 1999 Symp. on VLSI Circuits, Kyoto, Japan, 1999 IEEE, pp. 113–116, ISBN: 4–930813–95–6.

* cited by examiner

Primary Examiner—Margaret R. Wambach
(74) Attorney, Agent, or Firm—George D. Saile; Stephen B. Ackerman; Billy Knowles (57) ABSTRACT

A fractional-N frequency synthesizer has a modulus controller with multiple inputs that control an initial output frequency of the frequency synthesizer, an increment of variation of tuning of the frequency synthesizer, and a difference between two adjacent output frequency settings. The fractional frequency synthesizer includes a modulus controller, which controls the modulus factor for a multiple modulus frequency divider. The modulus controller has a modulus selection circuit that provides a modulus control signal to the modulus divider to select the modulus factor of the modulus divider as a function of a sum of one input factor and a product of a second input and the gain factor. Control signal is an overflow from a continuous summation of the second digital data word and a product of the first digital data word and the gain factor digital data word repetitively with itself.

40 Claims, 5 Drawing Sheets

FRACTIONAL-N SYNTHESIZER WITH TWO CONTROL WORDS

BACKGROUND OF THE INVENTION

1. Field of the Invention

This invention relates generally to frequency synthesizing circuits and system. More particularly, this invention relates to fractional-N frequency synthesizers, where an output frequency of the synthesizer is a non-integer multiple of a reference frequency. Even more particularly, this invention relates to fractional-N frequency synthesizers where the initial output frequency, frequency increment or step size, and a difference between channel frequencies are controlled by multiple input variables.

2. Description of Related Art

A frequency synthesizer, as is known in the art and described in "Fractional-N Synthesizers—White Paper", Staff, Conexant Systems, Inc., Newport Beach, Calif., February, 2001, is fundamentally a phased locked loop (PLL). A phase locked loop is a negative feedback oscillator that employs a phase frequency detector with a charge pump, a low pass filter, and a voltage controlled oscillator. The phase frequency detector receives a reference frequency and compares the phase of the output frequency to the phase of the input frequency and provides an error voltage indicating the difference in phase of the output frequency versus the reference frequency. The error voltage is passed through the low pass filter to eliminate any spurious transients in the error voltage. The filtered error voltage is applied to the voltage controlled oscillator. The error voltage changes the frequency of the voltage controlled oscillator until the phase and frequency of the output signal is equal to that of the reference input signal.

A phase locked loop becomes a frequency synthesizer when a frequency divider is applied between the fed back output frequency signal of the voltage controlled oscillator and the input of the phase frequency detector. The output frequency signal now becomes a multiple of the input frequency and that multiple is the modulus of the frequency divider. The frequency divider is in essence a state machine that is clocked by the output frequency signal of the voltage controlled oscillator. The output of the state machine changes state, whenever the output frequency signal has occurred the number of times of the modulus.

The frequency synthesizer becomes programmable when the modulus of the frequency divider is a digital number placed in a register of the frequency divider. The output frequency of the frequency synthesizer is an integer multiple of the reference frequency, even with a programmable modulus. Thus, the incremental frequency change for the output frequency signal is the magnitude of the frequency of the reference input.

Figure 1:
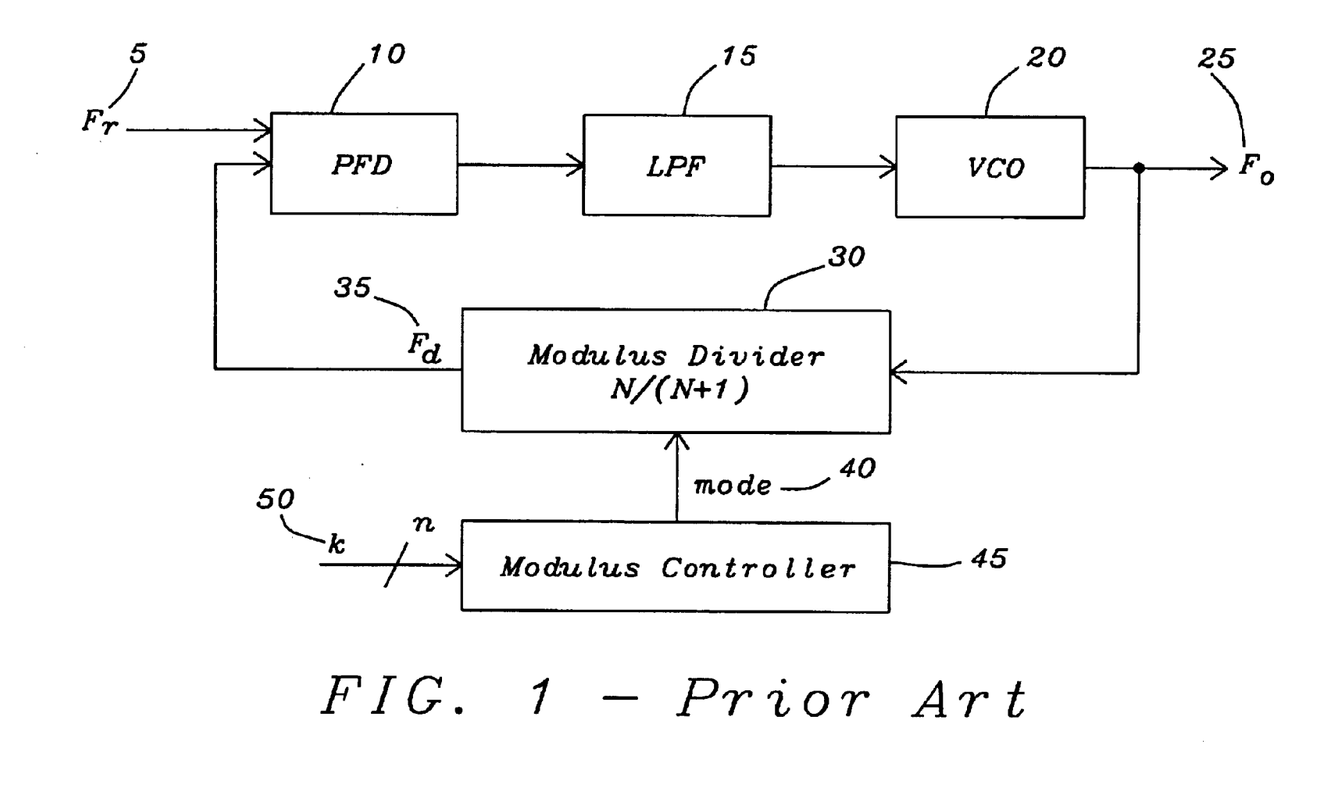
FIG. 1 is a functional block diagram of a fractional-N frequency synthesizer of the prior art.

In order to achieve an output frequency of the synthesizer that is not only an integer multiple of the reference frequency, but is a fractional multiple of the reference frequency, a fractional-N synthesizer was developed. Refer now to FIG. 1 for a discussion of the structure and operation of a dual modulus fractional-N frequency synthesizer. As discussed above, the frequency synthesizer is essentially a phase locked loop having a phase frequency detector 10 into which the reference input signal ($F_r$) 5 is applied. The phase frequency detector 10 incorporates a charge pump which provides an output voltage that is applied to the low pass filter 15. The low pass filter 15 removes any spurious transients from the output voltage and applied the filter voltage level to the voltage controlled oscillator 20. The filtered voltage level determines the frequency of the output signal ($F_o$) 25. The output signal ($F_o$) 25 is the input to the dual modulus frequency divider 30. The dual modulus frequency divider 30 divides the output signal ($F_o$) 25 by the factor N or N+1 dependent on the mode signal 40. The divided output signal ($F_d$) 35 is applied to the phase frequency detector 10 for comparison to the reference input signal ($F_r$) 5 to create the voltage level to adjust the frequency of the voltage controlled oscillator 20.

The modulus controller 45 generates the mode signal 40 as a function of the density data input (K) 50. The density data input (K) 50 is generally repetitively added to itself until there is an overflow of the addition. The overflow is used to cause the mode signal 40 to change the modulus of the dual modulus frequency divider 30. The repetitively addition of the density data input (K) 50 causes the frequency of the output signal ($F_o$) 25 to be determined by the equation:

$$F_o = N_{av} * F_r$$

where:
$F_o$ is the output signal 25.
$F_r$ is the reference input signal 5.

$$N_{av} = N + K/2^n$$

where:
N is the primary modulus of the dual modulus divider.
K is the density data input 50.
n is the number of bits in the density data input (K) 50.

The structure of the frequency synthesizer may be implemented in variations of the structure as described. In general the fundamental parameters are according to the following equations:

1. The step size of the increment of the frequency synthesizer is:

$$F_{step} = F_r * 1/2^n$$

here:
$F_{step}$ is the step size of the increments of that the frequency synthesizer may be adjusted
$F_r$ is the reference input signal 5.
n is the number of bits in the density data input (K) 50.

2. The minimum frequency of the output signal ($F_o$) 25 is:

$$F_{o\,min} = N * F_r$$

where:
$F_{omin}$ is the minimum frequency of the output signal ($F_o$) 25.
$F_r$ is the reference input signal 5.
N is the primary modulus of the dual modulus divider 30.

3. The maximum frequency of the output signal ($F_o$) 25 is:

$$F_{o\,max} = (N+1) * F_r$$

where:
$F_{omax}$ is the maximum frequency of the output signal ($F_o$) 25.
$F_r$ is the reference input signal 5.
N+1 is the secondary modulus of the dual modulus divider 30.

4. The reference input signal ($F_r$) 5 is the difference between the maximum frequency and the minimum frequency of the output signal ($F_o$) 25 or:

$$F_r = F_{o\,max} - F_{o\,min}.$$

"A Low Phase Noise C-Band Frequency Synthesizer Using a New Fractional-N PLL with Programmable Fractionality," Nakagawa et al., IEEE Transactions on Microwave Theory and Techniques, Volume: 44, Issue: 2, pp. 344–346, February 1996 describes a fractional-N phase locked loop that has an arbitrary denominator of the fractional division ratio as well as an arbitrary numerator and an integer part. In this case, the resulting modulus of the dividing factor N is now an averaged factor $N_{av}$ which is now found by the equation:

$$N_{av} = N + A/M$$

where:
N, A, and M are programmable factors of the frequency synthesizer.

U.S. Pat. No. 6,219,397 (Park) describes a Phase-Locked-Loop-based CMOS fractional-N frequency synthesizer. The frequency synthesizer has an on-chip LC Voltage Controlled Oscillator. A higher-order discrete sigma-delta modulator is used in the fractional-N frequency synthesizer resulting in a strong attention at low frequencies for quantization noise. The synthesizer employs a noise shaping method to suppress fractional spurs using the high-order sigma-delta modulator.

U.S. Pat. No. 4,758,802 (Jackson) teaches a Fractional N synthesizer. The fractional N synthesizer includes a voltage controlled oscillator which produces an output signal that is transferred to a phase detector via a variable divider to provide a control signal for the voltage controlled oscillator in the presence of a phase difference between a reference signal from a reference source and the signal from the variable divider. The synthesizer has two accumulators, the arrangement of the accumulators being such that an output signal that cancels the interpolation sidebands of the first accumulator caused by quantization errors in the first accumulator. The division ratio of the variable divider is set depending upon the output signal.

U.S. Pat. No. 5,224,132 (Goldberg) provides a programmable fractional-N frequency synthesizer The frequency synthesizer has a fractional divider using a counter to provide a fraction for the divider. The divider is used to divide the VCO output signal by N or N+1 as selected. A divider control circuit controls the divider to divide by the appropriate divisor to obtain the selected output frequency. The fractional divider circuit counts divider control signals which represent a first division period. The fractional divider circuit establishes a second period of multiple first periods and at the terminal count of each second period, the fractional divider circuits provides a selected number of fractional control signals to the divider control to cause division by a different number, such as N+1. The fractional divider includes a first counter programmed to count first periods and issue its terminal count upon receiving the programmed count of first periods The fractional divider also comprises a second counter to provide the selected number of fractional control signals upon receipt of the terminal count of the first counter. The first and second counters thus operate as a fraction for instance F/K results in a fractional reference frequency.

U.S. Pat. No. 5,714,896 (Nakagawa, et al.) describes a fractional-N frequency divider system that generates an output signal having frequency of an input signal divided by a desired frequency division ratio (N+A/M) in which N is an integer and A/M is a fraction, $A \leq M$. The frequency divider includes a programmable frequency divider receiving input frequency and providing divided frequency in which the division ratio (N, N+1) is an integer and is externally supplied. A selector supplies one of the externally supplied integers (N, N+1) to the divider according to a selection signal and a fractional part set having a first counter initialized to count M, a second counter initialized to count A, and a logic circuit for supplying the selection signal according to the counters. The counters are decremented by an output of the divider and reach zero when they receive M and A number of pulses, respectively The second counter stops counting operation when it reaches zero. The logic circuit makes the selector select an integer N in a condition when content of the first counter is not zero and content of the second counter is zero, and N+1 in other conditions, so that the division ratio in the divider is N+1 for A number of output pulses of the divider among M number of output pulses, and is N for M-A number of the output pulses U.S. Pat. No. 5,777,521 (Gillig, et al.) describes a parallel accumulator fractional-n frequency synthesizer. The frequency synthesizer includes a synthesizer loop with a fractional-N divider, and including a divider control circuit and a combining circuit. The divider control circuit provides a variable divide value to the divider. The carry values of two accumulators having differing accumulator lengths are applied in parallel to the combining circuit. Each of the accumulators provides a portion of a desired fractional divide value. The combining circuit also adds an integer divide value to the fractional divide value.

U.S. Pat. No. 5,124,670 (Lawton) teaches a frequency synthesizer with fractional division. The fractional-N synthesizer includes a phase locked loop that has a voltage controlled oscillator providing a loop output signal. The output signal is coupled via an N variable divider to a first input of a phase or frequency detector. A reference frequency source coupled to a second input of the phase or frequency detector. The detector provides an output a control signal that is dependent upon a comparison between the signals applied to the first and second inputs, for application to a control input of the voltage controlled oscillator. The synthesizer includes a circuit for setting the division ratio (N) of the variable divider in response to a frequency data word. The circuit includes an interpolator for periodically varying at least the LSB of the frequency data word. The interpolator has an input for receiving the LSB, a combiner for comparing the LSB with a feedback signal, a quantizer circuit, and a filter circuit. The quantizer circuit and the filter circuit provide a predetermined delay or integration function. The quantizer circuit and filter circuit are coupled to the combiner for providing said feedback signal and a ratio setting signal to the variable divider.

"Application Note for SA8025 Fractional-N synthesizer for 2 GHz band applications," AN1891, Djen, Philips Semiconductors, Aug. 20, 1997, describes the SA8025, which is a 3V, 1.8 GHz, SSOP 20-pin packaged fractional-N phase locked-loop (PLL) frequency synthesizer.

"A 5 Ghz, 32 Mw CMOS Frequency Synthesizer With an Injection Locked Frequency Divider," Rategh, Digest of Technical Papers 1999 Symposium on VLSI Circuits, Kyoto, Japan, 1999, IEEE, pp. 113–116, ISBN: 4-930813-95-6, describes a fully integrated 5 GHz phase locked loop—(PLL-) based frequency synthesizer. A voltage-controlled differential injection-locked frequency divider (VCDILFD) is used as the first frequency divider in the PLL feedback loop to reduce power consumption and eliminate the need for an off-chip frequency divider.

SUMMARY OF THE INVENTION

An object of this invention is to provide a fractional-N frequency synthesizer having a modulus controller with multiple inputs that control an initial output frequency of the frequency synthesizer, an increment of variation of tuning of the frequency synthesizer, and a difference between two adjacent output frequency settings.

To accomplish at least this object, a fractional frequency synthesizer includes a multiple modulus frequency divider connected to receive the output frequency of a voltage controlled oscillator and dependant upon a modulus factor select one of a plurality of divisors for the output frequency to generate a divided output signal. The divided output signal is phased compared to a reference frequency signal to create the control voltage for the voltage controlled oscillator.

A modulus controller is in communication with the multiple modulus frequency divider to control the modulus factor for the multiple modulus frequency divider. The modulus controller has a first factor input, a second factor input and a gain factor input to respectively receive a first digital data word, a second digital data word and a gain factor digital data word. The first digital data word has a first number of bits and the second digital data word has a second number of bits. The gain factor digital data word is an integer multiplier for the first digital data word.

The modulus controller has a modulus selection circuit in communication with the first factor input, the second factor input, and the gain factor input. The modulus selection circuit provides a modulus control signal to the modulus divider to select the modulus factor of the modulus divider as a function of a sum of the second digital data word and a product of the first digital data word and the gain factor digital data word. The function of the sum of the second digital data word and the product of the first digital data word and the gain factor digital data word is an overflow from a continuous summation of the second digital data word and a product of the first digital data word and the gain factor digital data word repetitively with itself.

The data values of the first digital data word, the second data word, and the gain factor data word control an initial output frequency of the frequency synthesizer, an increment of variation of tuning of the frequency synthesizer, and a difference between two adjacent output frequency settings. There are primarily two ways of controlling the synthesizer behaviour. In the first approach, the increment of variation or step size of the output frequency is determined by the equation $$F_{inc}=(1/2^n) \cdot F_r$$

where:

$F_{inc}$ is the increment of variation of tuning, and $F_r$ is a reference frequency for the frequency synthesizer.

n is the number of bits representing the second data word.

The initial output frequency is determined by the equation:

$$F_{init}=F_r * Ad/2^m$$

where:

$F_{init}$ is the initial output frequency.

$F_r$ is a reference frequency for the frequency synthesizer.

d is the first digital data word.

A is the gain factor digital data word, and m is the number of bits representing the first data word.

In a second approach of the frequency synthesizer, the output frequency is adjusted by varying the gain factor digital data word. The increment of variation is determined by the equation $$F_{inc}=F_r * d/2^m$$

where:

$F_{inc}$ is the increment of variation of tuning.

d is the first digital data word, and m is the number of bits representing the first data word.

The initial output frequency is determined by the equation:

$$F_{init}=F_r * f/2^n$$

where:

$F_{init}$ is the initial output frequency.

$F_r$ is a reference frequency for the frequency synthesizer.

f is the second digital data word, and n is the number of bits representing the second data word.

The modulus selection circuit includes a gain factor counter to provide an enable signal indicating the number of counts of the reference clock equal to the gain factor data word. A first adder to repetitively add the first digital data word until the enable signal is active indicating the number of times the repetitive addition of the first digital data word has been completed. When the enable signal is active, a second adder adds the product of the gain factor digital data word and the first digital data word to the second digital data word. A third adder is in communication with the second adder to receive the sum of the second digital data word and a product of the first digital data word and the gain factor digital data word. The third adder output exclusive of the overflow signal is connected to one of the inputs of the third adder to repetitively add the sum of the second digital data word and a product of the first digital data word and the gain factor digital data word. The overflow signal is provided at an overflow output of the third adder, the overflow signal being the modulus control signal is applied to the multiple modulus frequency divider.

DETAILED DESCRIPTION OF THE INVENTION

Figure 2:
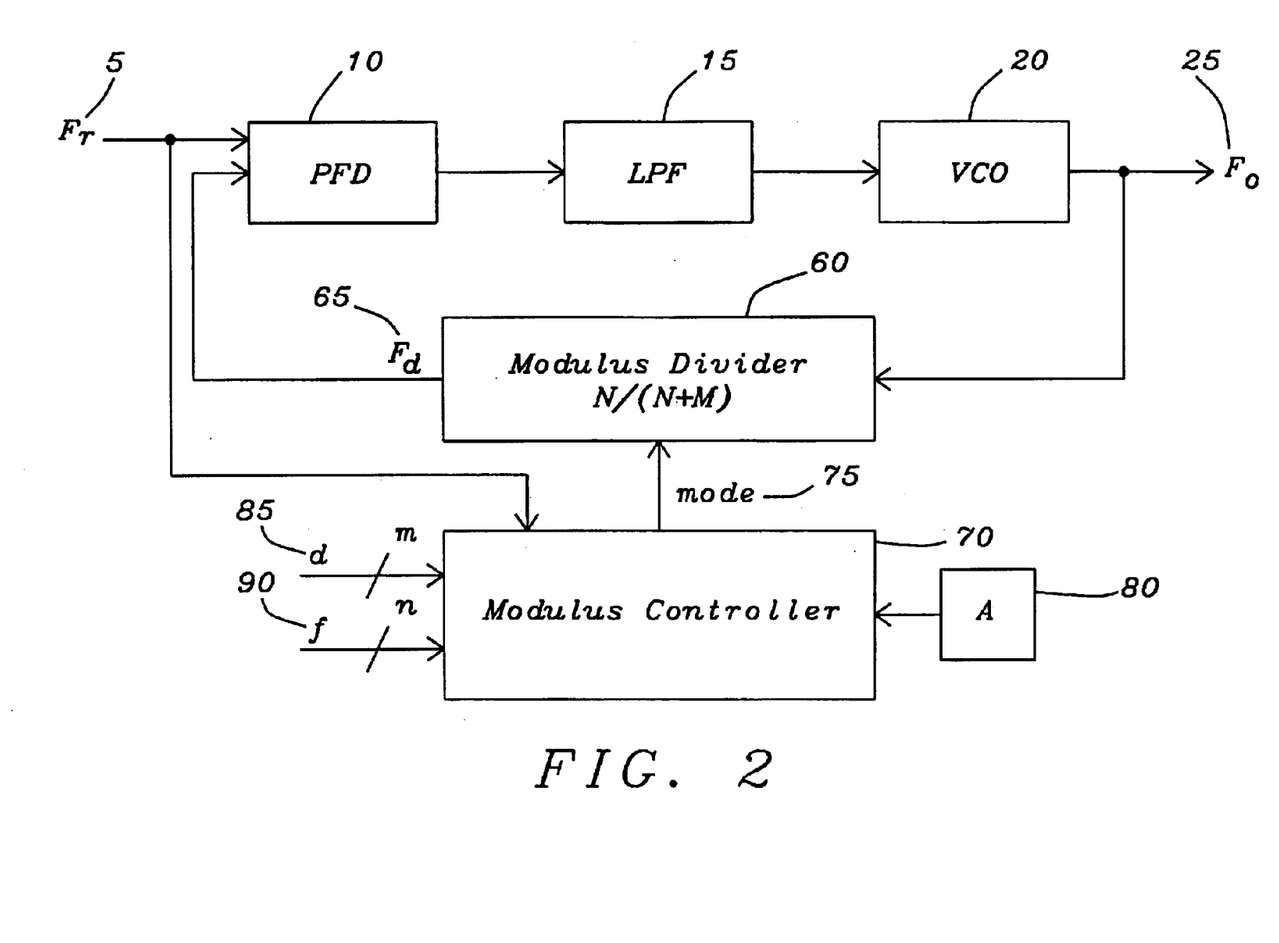
FIG. 2 is a functional block diagram of a first embodiment of a fractional-N frequency synthesizer of this invention.

The frequency synthesizer of this invention has a first factor input, a second factor input, and a gain factor input that are applied to a modulus controller. The function of the first factor input, the second factor input, and the gain factor input determine a mode select to select the appropriate modulus for a dual modulus divider circuit. Refer now to FIG. 2 for a more detailed discussion of a first embodiment of the structure and operation of the frequency synthesizer of this invention. The frequency synthesizer has the basic components (phase frequency detector 10, low pass filter 15, and voltage controlled oscillator 20) that compose the phase locked loop as described in FIG. 1. The dual modulus divider 60 in this instance has second factor (M) which is determined by the maximum output frequency requirements of the synthesizer as determined by the equations:

1. The minimum frequency of the output signal ($F_o$) 25 is:

$$F_{o\ min}=N*F_r$$

where:
$F_{omin}$ is the minimum frequency of the output signal ($F_o$) 25.
$F_r$ is the reference input signal 5.
N is the primary modulus of the dual modulus divider 60.

2. The maximum frequency of the output signal ($F_o$) 25 is:

$$F_{o\ max}=(N+M)*F_r$$

where:
$F_{omax}$ is the maximum frequency of the output signal ($F_o$) 25.
$F_r$ is the reference input signal 5.
N+M is the secondary modulus of the dual modulus divider 60.

3. The difference between the maximum frequency and the minimum frequency of the output signal ($F_o$) 25 is the product of the factor M and the reference input signal ($F_r$) 5 is or:

$$F_{o\ max}-F_{o\ min}=M*F_r$$

The divided output signal ($F_d$) 65 is the output signal ($F_o$) 25 divided by an average ($N_{av}$) of the modulus factors N and N+M. The modulus controller 70 provides the mode selection or modulus selection signal 75 to the dual modulus divider 60 for selecting the modulus factors N and N+M.

The modulus controller 70 has a first modulus factor selection input (d) 85 and a second modulus factor selection input (f) 90. The first modulus factor selection input 85 is a digital data word having a specific number (m) of data bits and the second modulus factor selection input 90 is digital data word having a specific number (n) of data bits. A gain factor input (A) 80 provides a product gain factor that is to be multiplied by the first modulus factor selection input 85. The modulus controller repetitively adds the sum of the a second modulus factor selection input 90 and the product first modulus factor selection input 85 and the gain factor input (A) 80. The mode select signal 75 becomes active when the repetitive addition has an overflow. When the mode select signal 75 switches state between active (1) and inactive (0), the modulus divider switches between the first modulus N and the second modulus N+M.

The data values of the first digital data word, the second data word, and the gain factor data word control an initial output frequency of the frequency synthesizer, an increment of variation of tuning of the frequency synthesizer, and a difference between two adjacent output frequency settings. There are primarily two ways of controlling the synthesizer behaviour. In the first approach, the increment of variation or step size of the output frequency is determined by the equation $$F_{inc}=(1/2^n)\cdot F_r$$

where:
$F_{inc}$ is the increment of variation of tuning, and
$F_r$ is a reference frequency for the frequency synthesizer.
n is the number of bits representing the second data word.

The initial output frequency is determined by the equation:

$$F_{init}=F_r*Ad/2^m$$

where:
$F_{init}$ is the initial output frequency.
$F_r$ is a reference frequency for the frequency synthesizer.
d is the first digital data word.
A is the gain factor digital data word, and
m is the number of bits representing the first data word.

In a second embodiment of the frequency synthesizer, the output frequency is adjusted by varying the gain factor digital data word. The increment of variation is determined by the equation $$F_{inc}=F_r*d/2^m$$

where:
$F_{inc}$ is the increment of variation of tuning.
d is the first digital data word, and
m is the number of bits representing the first data word.

The initial output frequency is determined by the equation:

$$F_{init}=F_r*f/2^n$$

where:
$F_{init}$ is the initial output frequency.
$F_r$ is a reference frequency for the frequency synthesizer.
f is the second digital data word, and
n is the number of bits representing the second data word.

The frequency of the output signal ($F_o$) 25 is:

$$F_o=N_{av}*F_r$$

where:
$F_o$ is the frequency of the output signal ($F_o$) 25.
$F_r$ is the reference input signal 5.

$$N_{av}=N+M*(Ad+f)/2^p$$

where:
A is the gain factor input 80.
d is the first modulus factor selection input 85.
f is the a second modulus factor selection input 90.
p is the number of bit representing (Ad+f) as determined by the formula:

$$0 \le \frac{(Ad+f)}{2^p} \le 1.$$

Figure 3:
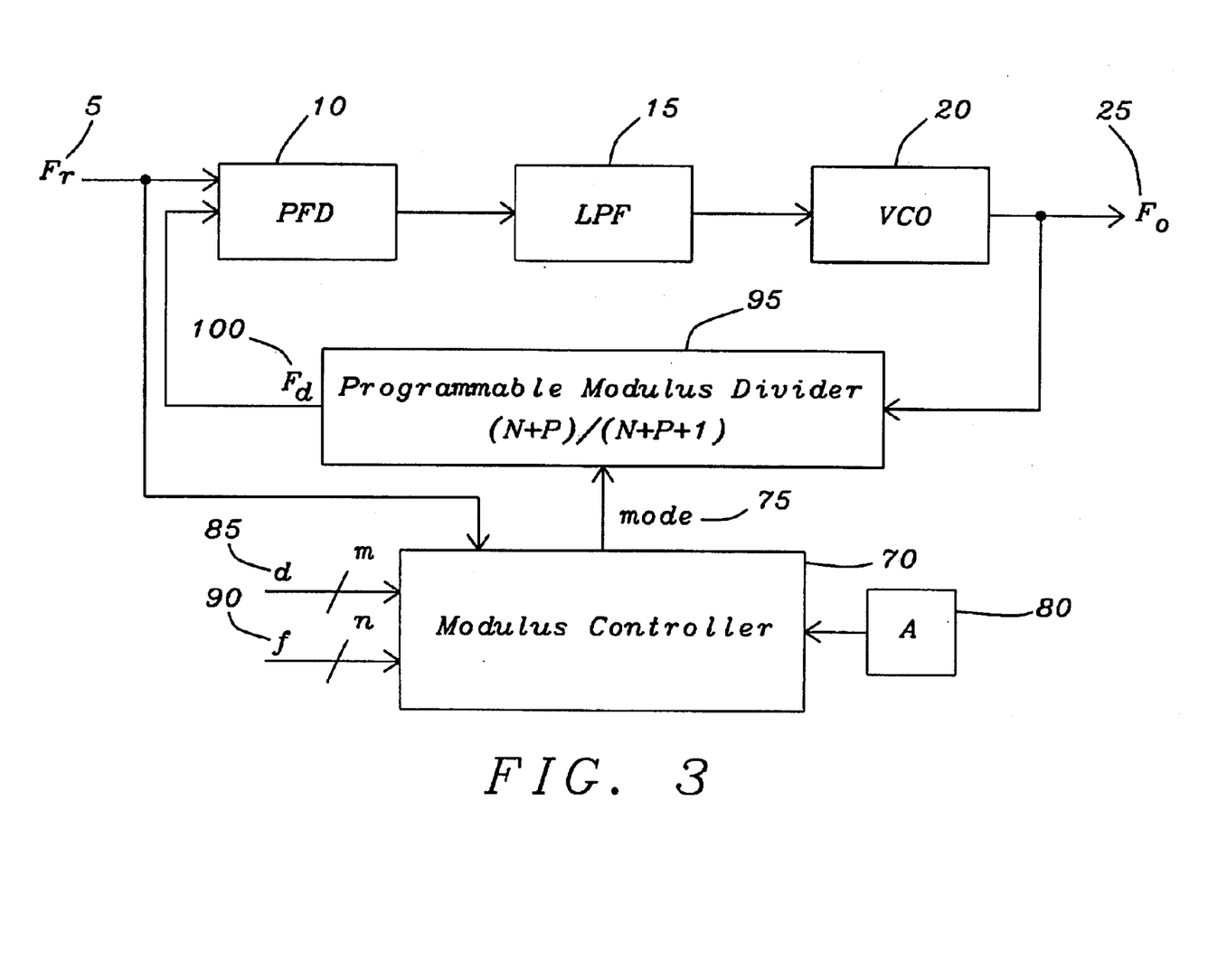
FIG. 3 is a functional block diagram of a second embodiment of a fractional-N frequency synthesizer of this invention.

FIG. 3 illustrates the structure and operation of a second embodiment of the frequency synthesizer of this invention.

The frequency synthesizer, as shown in FIG. 2, has the basic components (phase frequency detector 10, low pass filter 15, and voltage controlled oscillator 20) that compose the phase locked loop as described in FIG. 1 The dual modulus divider 95 in this instance has two programmable modulous factors (N+P and N+P+1). The value of P can be programmed based on the minimum and maximum frequencies available for the synthesizer as determined by the equations:

1. The minimum frequency of the output signal ($F_o$) 25 is:

$$F_{o\ min}=N*F_r \text{ for } P=0$$

where:
$F_{omin}$ is the minimum frequency of the output signal ($F_o$) 25.
$F_r$ is the reference input signal 5.
N+P is the primary modulus factor of the dual modulus divider 95.

2. The maximum frequency of the output signal ($F_o$) 25 is:

$$F_{o\ max}=(N+P+1)*F_r$$

where:
$F_{omax}$ is the maximum frequency of the output signal ($F_o$) 25.
$F_r$ is the reference input signal 5.
N+P+1 is the secondary modulus factor of the dual modulus divider 95.

3. The difference between the maximum frequency and the minimum frequency of the output signal ($F_o$) 25 is the product of the factor P+1 and the reference input signal ($F_r$) 5 is or:

$$F_{o\ max}-F_{o\ min}=(P+1)*F_r.$$

The divided output signal ($F_d$) 100 is the output signal ($F_o$) 25 divided by an average ($N_{av}$) of the modulus factors N+P and N+P+1. The modulus controller 70 provides the mode selection or modulus selection signal 75 to the dual modulus divider 95 for selecting the modulus factors N+P and N+P+1.

The modulus controller 70, as described above, has a first modulus factor selection input (d) 85 and a second modulus factor selection input (f) 90. The first modulus factor selection input 85 is a digital data word having a specific number (m) of data bits and the second modulus factor selection input 90 is digital data word having a specific number (n) of data bits. A gain factor input (A) 80 provides a product gain factor that is to be multiplied by the first modulus factor selection input 85. The modulus controller repetitively adds the sum of the a second modulus factor selection input 90 and the product first modulus factor selection input 85 and the gain factor input (A) 80. The mode select signal 75 becomes active when the repetitive addition has an overflow. When the mode select signal 75 switches state between active (1) and inactive (0), the modulus divider switches between the first modulus N+P+1 and the second modulus N+P.

The data values of the first digital data word, the second data word, and the gain factor data word control an initial output frequency of the frequency synthesizer, an increment of variation of tuning of the frequency synthesizer, and a difference between two adjacent output frequency settings. There are primarily two ways of controlling the synthesizer behaviour. In the first approach, the increment of variation or step size of the output frequency is determined by the equation $$F_{inc}=(1/2^n)\cdot F_r$$

where:
$F_{inc}$ is the increment of variation of tuning, and
$F_r$ is a reference frequency for the frequency synthesizer.
n is the number of bits representing the second data word.

The initial output frequency is determined by the equation:

$$F_{init}=F_r*Ad/2^m$$

where:
$F_{init}$ is the initial output frequency.
$F_r$ is a reference frequency for the frequency synthesizer.
d is the first digital data word.
A is the gain factor digital data word, and
m is the number of bits representing the first data word In a second approach of the frequency synthesizer, the output frequency is adjusted by varying the gain factor digital data word. The increment of variation is determined by the equation $$F_{inc}=F_r*d/2^m$$

where:
$F_{inc}$ is the increment of variation of tuning.
d is the first digital data word, and
m is the number of bits representing the first data word.

The initial output frequency is determined by the equation:

$$F_{init}=F_r*f/2^n$$

where:
$F_{init}$ is the initial output frequency.
$F_r$ is a reference frequency for the frequency synthesizer.
f is the second digital data word, and
n is the number of bits representing the second data word.

The frequency of the output signal ($F_o$) 25 is:

$$F_o=N_{av}*F_r$$

where:
$F_o$ is the frequency of the output signal ($F_o$) 25.
$F_r$ is the reference input signal 5.

$$N_{av}=N+P+(Ad+f)/2^p$$

where:
P is programmable factors of the frequency synthesizer
A is the gain factor input 80.
d is the first modulus factor selection input 85.
f is the a second modulus factor selection input 90.
p is the number of bits representing $(Ad+f)$ and $0<(Ad+f)/2^p<1$.

Figure 4:
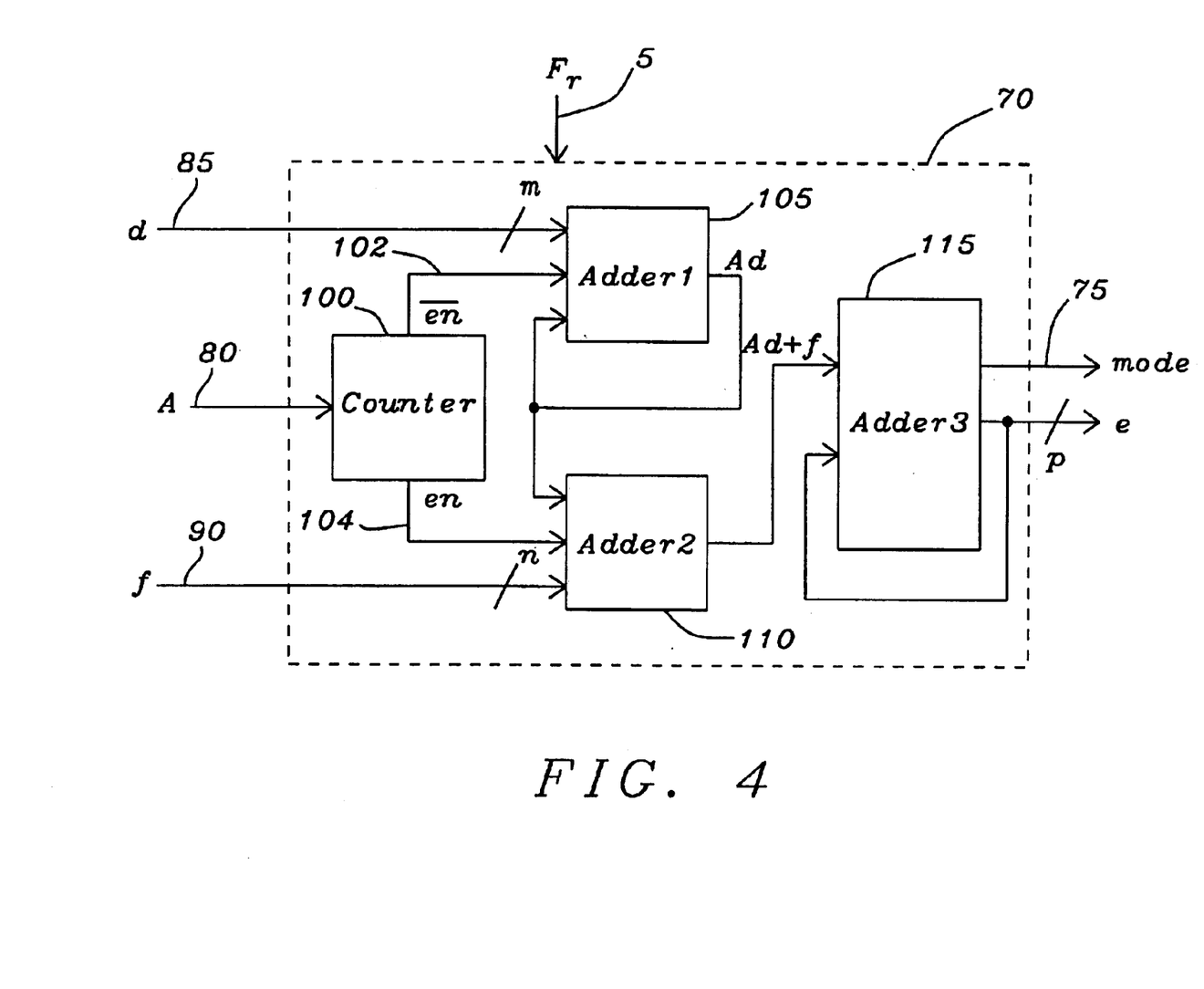
FIG. 4 is a block diagram of the modulus controller of the fractional-N frequency synthesizer of this invention.

The modulus controller of 70, as shown in FIG. 4, has three adder circuits and a counter that generate the mode select signal 75 as an over flow signal from one of the adders. The modulus controller 70 receives the reference clock ($F_r$) 5 to provide timing for the three adders and the counter. The first adder 105 receives the first input factor (d)

85 to its first input. The summing output is fed back to a second input to be repetitively added with itself for the number of times determined by the gain factor input (A) 80. The gain factor input (A) 80 is the input to the first counter 100 is set to be decrement counter that counts from the value of the gain factor input (A) 80 to zero. At each decrement of the count of the counter 100, the adder 105 adds the first input factor (d) 85 to itself. This continues until the counter reaches zero and the product of the gain factor input (A) 80 and first input factor (d) 85 is transferred to the second adder 110.

When the counter 100 has reached the zero, the second adder 110 is enabled and the product of the gain factor input (A) 80 and the first input factor (d) 85 is added to the second input factor (f) 90. The summing output of the second adder 110 being the addition of the second input factor (f) 90 and the product of the gain factor input (A) 80 and first input factor (d) 85 is the input of the third adder 115.

The summing output of the third adder 115 is fed back to the second input of the third adder 115. At each active clock edge of the reference clock 5 the third adder adds the function (Ad+f) to itself. When the third adder 115 reaches an overflow condition the mode signal 75 becomes active and the modulus divider transfers from one modulus to the second modulus.

Figure 5:
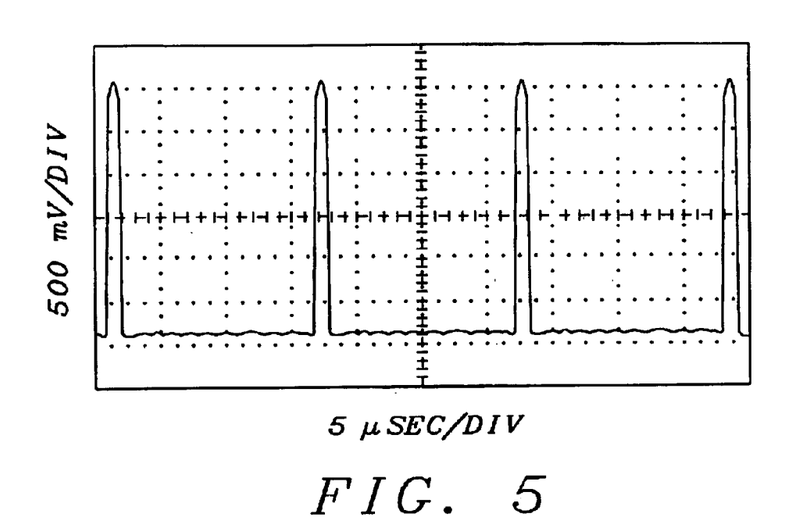
FIGS. 5 and 6 are plots of two typical outputs showing the density of the mode signals that provide the modulus controls for the dual modulus divider for the fractional-N frequency synthesizer of this invention.
Figure 6:
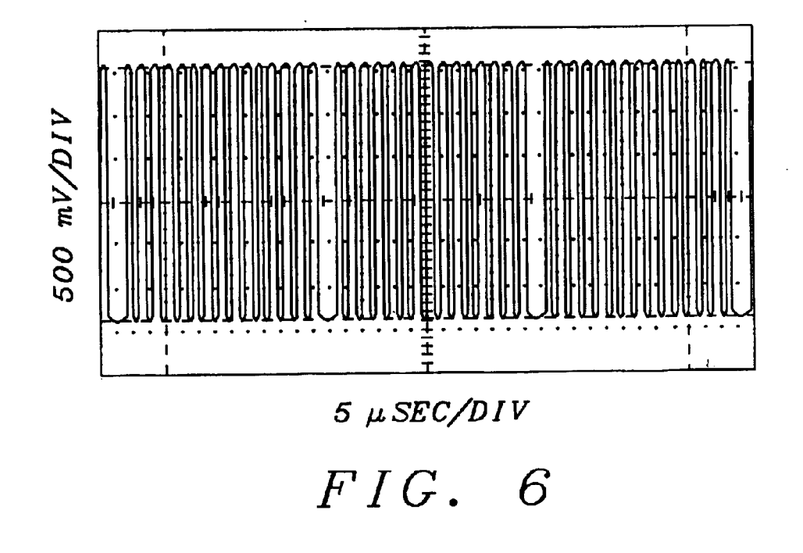

FIGS. 5 and 6 illustrate typical results of a modulus controller as described in FIG. 4 and integrated in CMOS technology. The modulus controller is tested for various control inputs. The observations of FIGS. 5 and 6 show the density of mode being active while operated at 1 MHz. FIG. 5 shows a density of four out of fifty input cycles. It implies:

$$(Ad+f)/2^p=4/50=0.08$$

FIG. 6 shows that the mode signal is active during 45 times during 50 input cycles, which implies:

$$(Ad+f)/2^p=45/50=0.9.$$

In this integration, a minimum density of 0.0002 has been shown. This allows a minimum step size of 200 Hz for a reference frequency (Fr) of 1 MHz.

An advantage of the frequency synthesizer of this invention having a modulus controller with multiple inputs as described is that it is adaptable to a wide range of output frequencies with high degree of flexibility for control. The relationship between the reference input frequency $F_r$ and step size is varied for different applications and hence provides a high degree of freedom to cover multiple applications. The frequency synthesizer of this invention has larger degree of flexibility to control output frequencies and step size compared to the prior art. The output frequency range ($F_{omax}-F_{omin}$) is M* $F_r$ for the frequency synthesizer of FIG. 2 and is (P+1)*$F_r$ for the frequency synthesizer of FIG. 3. In the basic frequency synthesizer as shown in FIG. 1 the output frequency range is that of the reference frequency $F_r$ only.

While this invention has been particularly shown and described with reference to the preferred embodiments thereof, it will be understood by those skilled in the art that various changes in form and details may be made without departing from the spirit and scope of the invention.

The invention claimed is:

1. A modulus controller for use in a fractional frequency synthesizer to control a modulus factor of a modulus divider of said fractional frequency divider, said modulus controller comprising:
   a first factor input to receive a first digital data word having a first number of bits;
   a second factor input to receive a second digital data word having a second number of bits;
   a gain factor input to receive a gain factor digital data word indicating an integer multiplier for the first digital data word; and
   a modulus selection circuit in communication with the first factor input, the second factor input, and the gain factor input to provide a modulus control signal to said modulus divider to select the modulus factor of said modulus divider as a function of a sum of the second digital data word and a product of the first digital data word and the gain factor digital data word.

2. The modulus controller of claim 1 wherein the function of the sum of the second digital data word and the product of the first digital data word and the gain factor digital data word is an overflow from a continuous summation of the second digital data word and a product of the first digital data word and the gain factor digital data word repetitively with itself.

3. The modulus controller of claim 1 wherein the first digital data word, the second data word, and the gain factor data word control an initial output frequency of said frequency synthesizer, an increment of variation of tuning of said frequency synthesizer, and a difference between two adjacent output frequency settings.

4. The modulus controller of claim 3 wherein the said increment of variation is determined by the equation $$F_{inc}=(1/2^n)\cdot F_r$$

where:
   $F_{inc}$ is the increment of variation of tuning, and
   $F_r$ is a reference frequency for said frequency synthesizer,
   n is the second number of bits representing the second digital data word.

5. The modulus controller of claim 4 wherein the initial output frequency is determined by the equation:

$$F_{init}=F_r*Ad/2^m$$

where:
   $F_{init}$ is the initial output frequency,
   $F_r$ is a reference frequency for said frequency synthesizer,
   d is the first digital data word,
   A is the gain factor digital data word, and
   m is the first number of bits.

6. The modulus controller of claim 5 wherein the output frequency settings are adjusted by varying the second digital data word.

7. The modulus controller of claim 3 wherein the said increment of variation is determined by the equation $$F_{inc}=F_r*d/2^m$$

where:
   $F_{inc}$ is the increment of variation of tuning,
   $F_r$ is a reference frequency for said frequency synthesizer.
   d is the first digital data word, and
   m is the first number of bits representing the first digital data word.

8. The modulus controller of claim 7 wherein the initial output frequency is determined by the equation:

$$F_{init}=F_r*f/2^n$$

where:

$F_{int}$ is the initial output frequency, $F_r$ is a reference frequency for said frequency synthesizer, f is the second digital data word, and n is the second number of bits representing the second digital data word.

9. The modulus controller of claim 8 wherein the output frequency settings are adjusted by varying the gain factor digital data word.

10. The modulus controller of claim 1 wherein the modulus selection circuit comprises:

a gain factor counter in communication with the gain factor input, said gain factor counter providing an enable signal at a count equal to the gain factor digital data word;

a first adder in communication with the first factor input to receive the first digital data word and the gain factor counter to receive the enable signal and having an input connected to an output of said first adder, said first adder repetitively adding said first digital data word to itself for a number of times equal to said gain factor digital data word to produce the product of the first digital data word and the gain factor digital data word;

a second adder in communication with the second factor input to receive the second digital data word, the gain factor counter to receive the enable signal, and the first adder to receive the product of the first digital data word and the gain factor digital data word from said first adder, said second adder summing the second digital data word to the product of the first digital data word and the gain factor digital data word upon receipt of the enable signal indicating the product of the first digital data word and the gain factor digital data word is valid; and a third adder in communication with the second adder to receive the sum of the second digital data word and a product of the first digital data word and the gain factor digital data word, having an output connected to the input of said third adder to repetitively add the sum of the second digital data word and a product of the first digital data word and the gain factor digital data word until said third adder generates an overflow signal at an overflow output of said third adder, said overflow signal being the modulus control signal.

11. A fractional frequency synthesizer to provide an output frequency that is a multiple of a reference input frequency, comprising:

a multiple modulus frequency divider connected to receive the output frequency and dependant upon a modulus factor select one of a plurality of divisors for said output frequency;

a modulus controller in communication with the multiple modulus frequency divider to control the modulus factor, said modulus controller comprising:

a first factor input to receive a first digital data word having a first number of bits;

a second factor input to receive a second digital data word having a second number of bits;

a gain factor input to receive a gain factor digital data word indicating an integer multiplier for the first digital data word; and a modulus selection circuit in communication with the first factor input, the second factor input, and the gain factor input to provide a modulus control signal to said modulus divider to select the modulus factor of said modulus divider as a function of a sum of the second digital data word and a product of the first digital data word and the gain factor digital data word.

12. The frequency synthesizer of claim 11 wherein the function of the sum of the second digital data word and the product of the first digital data word and the gain factor digital data word is an overflow from a continuous summation of the second digital data word and a product of the first digital data word and the gain factor digital data word repetitively with itself.

13. The frequency synthesizer of claim 11 wherein the first digital data word, the second data word, and the gain factor data word control an initial output frequency of said frequency synthesizer, an increment of variation of tuning of said frequency synthesizer, and a difference between two adjacent output frequency settings.

14. The frequency synthesizer of claim 13 wherein the said increment of variation is determined by the equation $$F_{inc} = (1/2^n) \cdot F_r$$

where:

$F_{inc}$ is the increment of variation of tuning, and $F_r$ is a reference frequency for said frequency synthesizer, n is the second number of bits representing the second digital data word.

15. The frequency synthesizer of claim 14 wherein the initial output frequency is determined by the equation:

$$F_{init} = F_r * Ad/2^m$$

where:

$F_{init}$ is the initial output frequency, $F_r$ is a reference frequency for said frequency synthesizer, d is the first digital data word, A is the gain factor digital data word, and m is the first number of bits representing the first digital data word.

16. The frequency synthesizer of claim 15 wherein the initial output frequency is adjusted by varying the second digital data word.

17. The frequency synthesizer of claim 13 wherein the said increment of variation is determined by the equation $$F_{inc} = F_r * d/2^m$$

where:

$F_{inc}$ is the increment of variation of tuning, $F_r$ is a reference frequency for said frequency synthesizer, d is the first digital data word, and m is the first number of bits representing the first digital data word.

18. The frequency synthesizer of claim 17 wherein the initial output frequency is determined by the equation:

$$F_{init} = F_r * f/2^n$$

where:

$F_{init}$ is the initial output frequency, $F_r$ is a reference frequency for said frequency synthesizer, f is the second digital data word, and n is the second number of bits representing the second digital data word.

19. The frequency synthesizer of claim 18 wherein the initial output frequency is adjusted by varying the gain factor digital data word.

20. The frequency synthesizer of claim 11 wherein the modulus selection circuit comprises:
- a gain factor counter in communication with the gain factor input, said gain factor counter providing an enable signal at a count equal to the gain factor digital data word;
- a first adder in communication with the first factor input to receive the first digital data word and the gain factor counter to receive the enable signal and having an input connected to an output of said first adder, said first adder repetitively adding said first digital data word to itself for a number of times equal to said gain factor digital data word to produce the product of the first digital data word and the gain factor digital data word;
- a second adder in communication with the second factor input to receive the second digital data word, the gain factor counter to receive the enable signal, and the first adder to receive the product of the first digital data word and the gain factor digital data word from said first adder, said second adder summing the second digital data word to the product of the first digital data word and the gain factor digital data word upon receipt of the enable signal indicating the product of the first digital data word and the gain factor digital data word is valid; and
- a third adder in communication with the second adder to receive the sum of the second digital data word and a product of the first digital data word and the gain factor digital data word, having an output connected to the input of said third adder to repetitively add the sum of the second digital data word and a product of the first digital data word and the gain factor digital data word until said third adder an overflow signal is provided at an overflow output of said third adder, said overflow signal being the modulus control signal.

21. A method for controlling a divisor modulus factor for a multiple modulus divider incorporated in a fractional frequency synthesizer, comprising the steps of:
- receiving a first factor input having a first number of bits;
- receiving a second factor input having a second number of bits;
- receiving a gain factor input indicating an integer multiplier for the first factor; and
- determining said divisor modulus factor for said multiple modulus divider as a function of a sum of the second factor input and a product of the first factor input and the gain factor input.

22. The method of claim 21 wherein the function of the sum of the second factor input and the product of the first factor input and the gain factor input is an overflow from a continuous summation of the second factor and a product of the first factor input and the gain factor input repetitively with itself.

23. The method of claim 21 wherein the first factor input, the second factor input, and the gain factor input control an initial output frequency of said frequency synthesizer, an increment of variation of tuning of said frequency synthesizer, and a difference between two adjacent output frequency settings.

24. The method of claim 23 wherein the said increment of variation is determined by the equation $$F_{inc}=(1/2^n){\cdot}F_r$$

where:
- $F_{inc}$ is the increment of variation of tuning, and
- $F_r$ is a reference frequency for said frequency synthesizer,
- n is the second number of bits representing the second factor input.

25. The method of claim 24 wherein the initial output frequency is determined by the equation:

$$F_{init}=F_r*Ad/2^m$$

where:
- $F_{init}$ is the initial output frequency,
- $F_r$ is a reference frequency for said frequency synthesizer,
- d is the first factor input,
- A is the gain factor input, and
- m is the first number of bits representing the first factor input.

26. The method of claim 25 wherein the initial output frequency is adjusted by varying the second factor input.

27. The method of claim 23 wherein the said increment of variation is determined by the equation $$F_{inc}=F_r*d/2^m$$

where:
- $F_{inc}$ is the increment of variation of tuning,
- $F_r$ is a reference frequency for said frequency synthesizer,
- d is the first factor input, and
- m is the first number of bits representing the first factor input.

28. The method of claim 27 wherein the initial output frequency is determined by the equation:

$$F_{init}=F^r*f/2^n$$

where:
- $F_{init}$ is the initial output frequency,
- $F_r$ is a reference frequency for said frequency synthesizer,
- f is the second factor input, and
- n is the second number of bits representing the second factor input.

29. The method of claim 28 wherein the initial output frequency is adjusted by varying the gain factor input.

30. The method of claim 21 wherein determining the divisor modulus factor comprises the steps of:
a) generating an enable signal indicating a reference signal has occurred for a count equal to the gain factor input;
b) repetitively adding the first factor to itself for a number of times equal to said gain factor to produce the product of the first factor input and the gain factor input;
c) adding the second factor and the product of the first factor input and the gain factor input upon receipt of the enable signal indicating the product of the first factor and the gain factor input is valid;
d) adding repetitively the sum of the second factor input and a product of the first factor input and the gain factor input;
e) generating an overflow signal;
f) dependant upon said overflow signal selecting said divisor modulus factor; and g) repeating steps a) through f) to adjust an output frequency of said frequency synthesizer.

31. An apparatus for controlling a divisor modulus factor for a multiple modulus divider incorporated in a fractional frequency synthesizer, comprising the steps of:

means for receiving a first factor input having a first number of bits;

means for receiving a second factor input having a second number of bits;

means for receiving a gain factor input indicating an integer multiplier for the first factor input; and means for determining said divisor modulus factor for said multiple modulus divider as a function of a sum of the second factor input and a product of the first factor input and the gain factor input.

32. The apparatus of claim 31 wherein the function of the sum of the second factor input and the product of the first factor input and the gain factor input is an overflow from a continuous summation of the second factor input and a product of the first factor input and the gain factor repetitively with itself.

33. The apparatus of claim 31 wherein the first factor input, the second factor input, and the gain factor input an initial output frequency of said frequency synthesizer, an increment of variation of tuning of said frequency synthesizer, and a difference between two adjacent output frequency settings.

34. The apparatus of claim 33 wherein the said increment of variation is determined by the equation $$F_{inc}=(1/2^n)\cdot F_r$$

where:

$F_{inc}$ is the increment of variation of tuning, and
$F_r$ is a reference frequency for said frequency synthesizer,
n is the second number of bits representing the second factor input.

35. The apparatus of claim 34 wherein the initial output frequency is determined by the equation:

$$F_{init}=F_r*Ad/2^m$$

where:

$F_{init}$ is the initial output frequency,
$F_r$ is a reference frequency for said frequency synthesizer,
d is the first factor input,
A is the gain factor, and
m is the first number of bits representing the first factor input.

36. The apparatus of claim 35 wherein the input output frequency is adjusted by varying the second factor input.

37. The apparatus of claim 33 wherein the said increment of variation is determined by the equation $$F_{inc}=F_r*d/2^m$$

where:

$F_{inc}$ is the increment of variation of tuning,
$F_r$ is a reference frequency for said frequency synthesizer,
d is the first factor input, and
m is the first number of bits representing the first factor input.

38. The apparatus of claim 37 wherein the initial output frequency is determined by the equation:

$$F_{init}=F_r*f/2^n$$

where:

$F_{init}$ is the initial output frequency,
$F_r$ is a reference frequency for said frequency synthesizer,
f is the second factor input, and
n is the second number of bits representing the second factor input.

39. The apparatus of claim 38 wherein the initial output frequency is adjusted by varying the gain factor input.

40. The apparatus of claim 31 wherein determining the divisor modulus factor comprises the steps of:

a) means for generating an enable signal indicating a reference signal has occurred for a count equal to the gain factor input;

b) means for repetitively adding the first factor input to itself for a number of times equal to said gain factor input to produce the product of the first factor input and the gain factor input;

c) means for adding the second factor input and the product of the first factor input and the gain factor input upon receipt of the enable signal indicating the product of the first factor input and the gain factor input is valid;

d) means for adding repetitively the sum of the second factor input and a product of the first factor input and the gain factor input;

e) means for generating an overflow signal;

f) means for selecting said divisor modulus factor, dependant upon said overflow signal; and g) means for repeatedly executing the means a) through f) to adjust an output frequency of said frequency synthesizer.

* * * * *